(12) United States Patent
Lin et al.

(10) Patent No.: US 10,468,258 B1
(45) Date of Patent: Nov. 5, 2019

(54) PASSIVATOR FOR GATE DIELECTRIC

(71) Applicant: Taiwan Semiconductor Manufacturing Company, Ltd., Hsinchu (TW)

(72) Inventors: Tsung-Da Lin, Pingtung County (TW); Che-Hao Chang, Hsinchu (TW); Cheng-Hao Hou, Hsinchu (TW); Xiong-Fei Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/005,986

(22) Filed: Jun. 12, 2018

(51) Int. Cl.
*H01L 21/28* (2006.01)
*H01L 29/66* (2006.01)
*H01L 29/78* (2006.01)
*H01L 29/49* (2006.01)

(52) U.S. Cl.
CPC .. *H01L 21/28247* (2013.01); *H01L 21/28088* (2013.01); *H01L 29/4966* (2013.01); *H01L 29/66545* (2013.01); *H01L 29/66795* (2013.01); *H01L 29/7851* (2013.01)

(58) Field of Classification Search
CPC ......... H01L 21/28247; H01L 21/28088; H01L 29/49666; H01L 29/66545; H01L 29/66795; H01L 29/7851
See application file for complete search history.

(56) References Cited

U.S. PATENT DOCUMENTS

| 2012/0323008 A1* | 12/2012 | Barry | C07F 1/08 546/11 |
| 2015/0132938 A1* | 5/2015 | Ahmed | H01L 29/517 438/591 |
| 2017/0069737 A1* | 3/2017 | Choi | H01L 29/66803 |
| 2017/0170027 A1* | 6/2017 | Hou | H01L 21/324 |
| 2017/0186868 A1* | 6/2017 | Cheng | H01L 29/7848 |

\* cited by examiner

*Primary Examiner* — Fernando L Toledo
*Assistant Examiner* — Neil R Prasad
(74) *Attorney, Agent, or Firm* — Slater Matsil, LLP

(57) ABSTRACT

Embodiments disclosed herein relate to formation of a gate structure of a device, such as in a replacement gate process, and the device formed thereby. In an embodiment, a method includes conformally forming a gate dielectric layer on a fin extending from a substrate and along sidewalls of gate spacers over the fin, conformally depositing a dummy layer over the gate dielectric layer during a deposition process using a silicon-containing precursor and a dopant gas containing fluorine, deuterium, or a combination thereof, the dummy layer as deposited comprising a dopant of fluorine, deuterium, or a combination thereof, performing a thermal process to drive the dopant from the dummy layer into the gate dielectric layer, removing the dummy layer, and forming one or more metal-containing layers over the gate dielectric layer.

20 Claims, 17 Drawing Sheets

PASSIVATOR FOR GATE DIELECTRIC

BACKGROUND

When fabricating field effect transistors (FETs), such as fin FETs (FinFETs), device performance can be improved by using a metal gate electrode instead of a polysilicon gate electrode. Formation of the metal gate electrode may include sequentially forming a gate dielectric layer, a barrier layer, a work function layer, and a metal liner layer in a high aspect ratio trench, followed by the trench filling with a fill material. High-k dielectric materials have been used in an effort to reduce gate oxide leakage current while maintaining a desired gate capacitance value. However, high-k dielectrics may suffer from high densities of defects which compromise the device performance. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
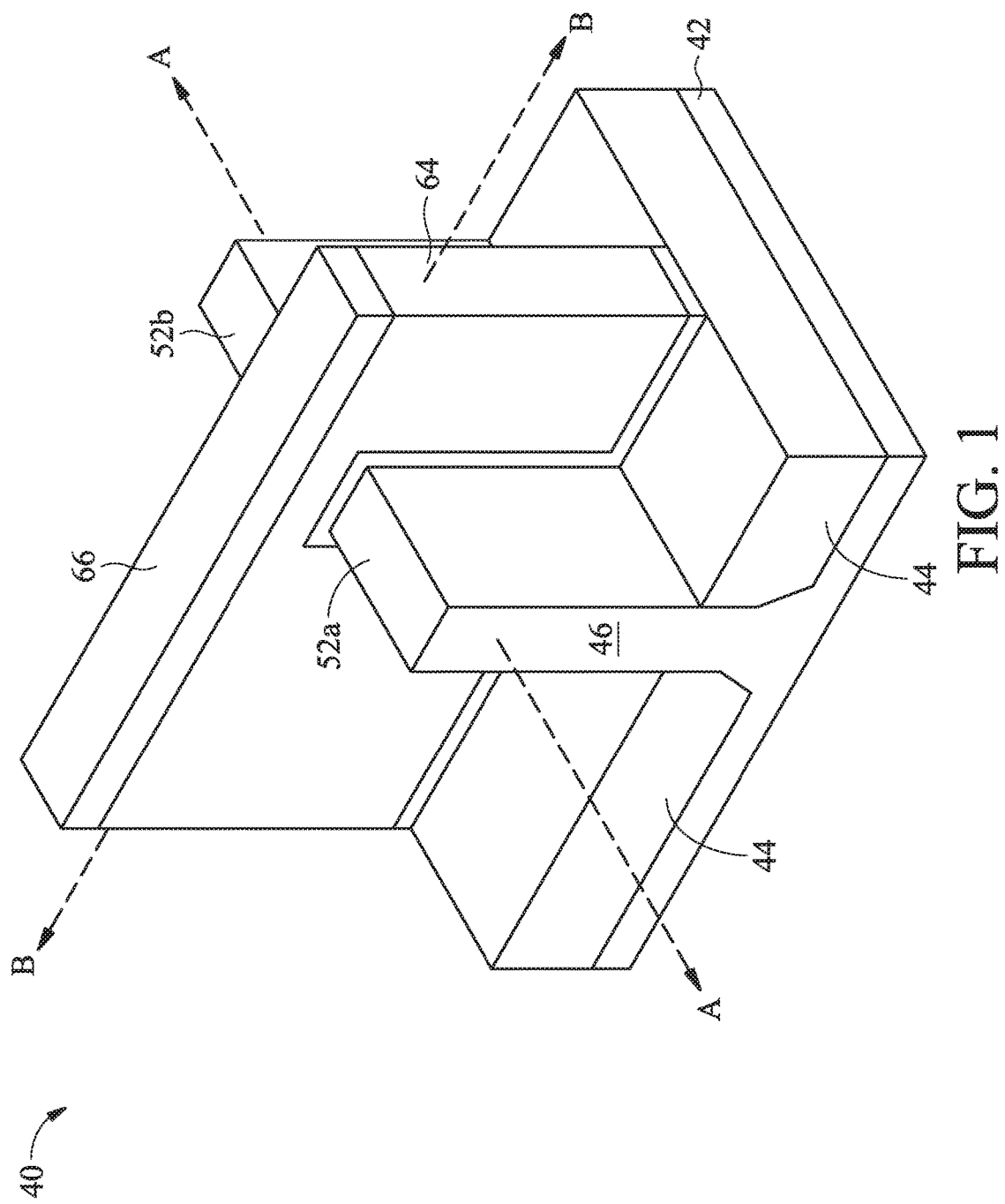
FIG. 1 is a three-dimensional view of an example intermediate Fin Field Effect Transistor (FinFET) structure in accordance with some embodiments.

The following disclosure provides many different embodiments, for examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to formation of a gate structure of a device, such as in a replacement gate process, and the device formed thereby. More specifically, in some examples, after a gate dielectric layer is deposited, a dummy layer containing a passivating species, such as fluorine or deuterium, is conformally formed over the gate dielectric layer, and a thermal process is performed to cause the passivating species to diffuse from the dummy layer into the gate dielectric layer thereby passivating the gate dielectric layer. The dummy layer is then removed, and subsequent layers of the gate structure are formed, such as one or more workfunction tuning layers and a gate fill metal. Among other benefits, device degradation, such as time-dependent dielectric breakdown (TDDB), and device performance can be improved.

FIG. 1 illustrates a three-dimensional view of an example of an intermediate Fin Field Effect Transistor (FinFET) structure 40 in accordance with some embodiments. A person having ordinary skill in the art will readily understand modifications to embodiments described herein to achieve implementations in other contexts. Although various operations are illustrated in the drawings and described herein, no limitation regarding the order of such steps or the presence or absence of intervening steps is implied. Operations depicted or described as sequential are, unless explicitly specified, merely done so for purposes of explanation without precluding the possibility that the respective steps are actually performed in concurrent or overlapping manner, at least partially, if not entirely.

The intermediate FinFET structure 40 includes a fin 46 on a semiconductor substrate 42. The fin 46 may be formed from and extended upwardly from a surface of the semiconductor substrate 42. The semiconductor substrate 42 includes isolation regions 44, and the fin 46 protrudes through and above the isolation regions 44. In the example shown, the fin 46 protrudes from between the neighboring isolation regions 44. A dummy gate stack, which includes an interfacial dielectric 62, a dummy gate layer 64 over the interfacial dielectric 62, and a mask 66 over the dummy gate layer 64, is disposed along sidewalls and over a top surface of the fin 46. Source/drain regions 52a and 52b are disposed in opposing regions of the fin 46 with respect to the dummy gate stack. FIG. 1 further illustrates reference cross-sections that are used in subsequent figures. Cross-section A-A is in a plane along, e.g., a channel in the fin 46 between the opposing source/drain regions 52a and 52b. Cross-section B-B is in a plane perpendicular to cross-section A-A and is along gate structures on the channel in the fin 46. Subsequent figures refer to these reference cross-sections for clarity. The following figures ending with an "A" designation illustrate cross-sectional views at various instances of processing corresponding to cross-section A-A, and the following figures ending with a "B" designation illustrate cross-sectional views at various instances of processing corresponding to cross-section B-B. In some figures, some reference numbers of components or features illustrated therein may be omitted to avoid obscuring other components or features.

Figure 2A:
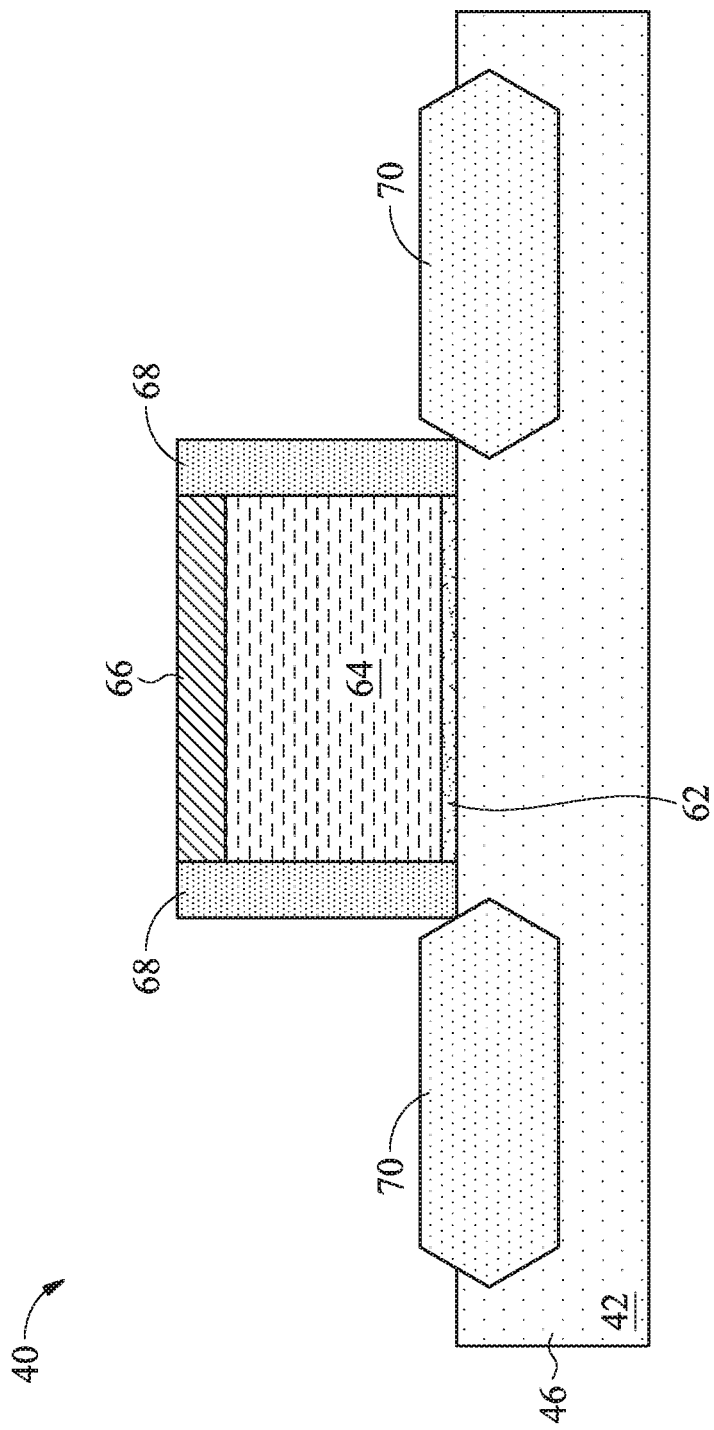
FIGS. 2A-B, 3A-B, 4A-B, 5A-B, 6A-B, 7A-B, 8A-B, and 9A-B are cross-sectional views of respective intermediate structures along line A-A and line B-B of FIG. 1 during an example method for forming a semiconductor device in accordance with some embodiments.
Figure 2B:
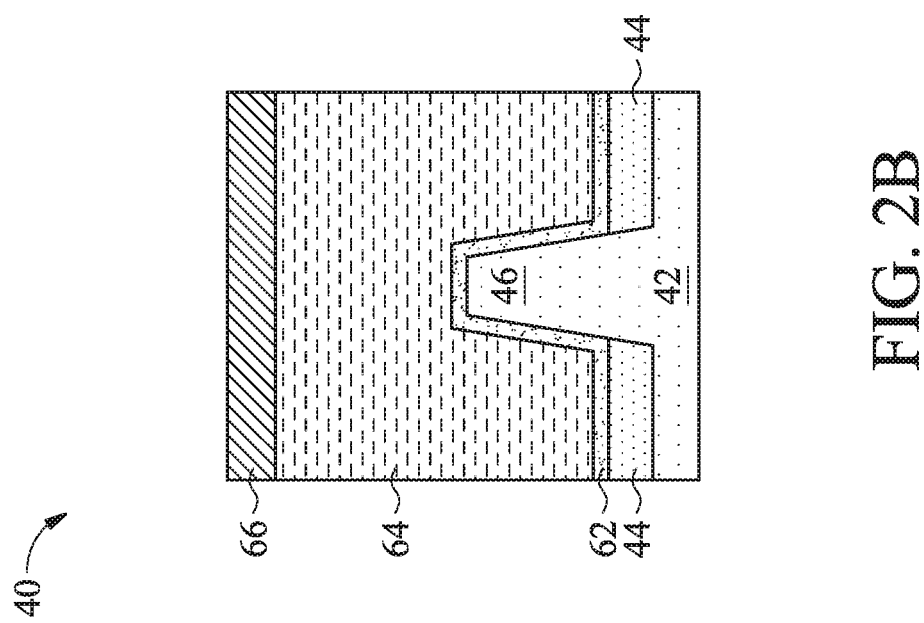

FIGS. 2A-B through 9A-B illustrate cross-sectional views of respective intermediate structures during an example method for forming a semiconductor device in accordance with some embodiments. The semiconductor device can be a Field Effect Transistor (FET), which may be a FinFET like shown in FIG. 1, a planar FET, a Horizontal Gate All Around (HGAA) FET, or any suitable device. FIGS. 2A-B illustrate a semiconductor substrate 42 with at least a portion of the semiconductor device formed thereon. The semiconductor substrate 42 may be or include a bulk semiconductor, a semiconductor-on-insulator (SOI) substrate, or the like, which may be doped (e.g., with a p-type or an n-type dopant) or undoped. In some embodiments, the semiconductor material of the semiconductor substrate 42 may include an elemental semiconductor such as silicon (Si) or germanium (Ge); a compound semiconductor; an alloy semiconductor; or a combination thereof. Generally, fins 46 can be formed in the semiconductor substrate 42 by etching trenches in the semiconductor substrate 42 using photolithography and etching processes. Insulating material, such as silicon oxide, silicon nitride, the like, multi-layers thereof, or a combination thereof, can be deposited in the trenches and recessed to form the isolation regions 44 with the fins 46 protruding therefrom.

The interfacial dielectric 62, dummy gate layer 64, and mask layer 66 for the dummy gate stack may be formed by sequentially forming or depositing the respective layers by any suitable processes, and then patterning those layers into the dummy gate stack. For example, the interfacial dielectric 62 may include or be silicon oxide, silicon nitride, the like, or multilayers thereof; the dummy gate layer 64 may include or be silicon (e.g., amorphous silicon or poly-silicon) or any suitable material; and the mask layer 66 may include or be silicon nitride, silicon oxynitride, silicon carbon nitride, the like, or a combination thereof. The layers for the interfacial dielectric 62, dummy gate layer 64, and mask layer 66 may then be patterned to form the dummy gate stack, for example, using photolithography and one or more etch processes.

FIGS. 2A-B illustrate the formation of gate spacers 68 along sidewalls of the dummy gate stack (e.g., sidewalls of the interfacial dielectric 62, dummy gate layer 64, and mask layer 66) and over the fin 46 on the semiconductor substrate 42. The gate spacers 68 may be formed by conformally depositing one or more layers for the gate spacers 68 and anisotropically etching the one or more layers, for example. The one or more layers for the gate spacers 68 may include or be silicon nitride, silicon oxynitride, silicon carbon nitride, the like, multi-layers thereof, or a combination thereof.

Source/drain regions 70 are then formed in the fin 46 on opposing sides of the dummy gate stack. In some examples, the source/drain regions 70 are formed by implanting dopants into the fin 46 using the dummy gate stack and gate spacers 68 as a mask. In other examples, such as illustrated, the fin 46 may be recessed, by an etching process, using the dummy gate stack and gate spacers 68 as a mask, and epitaxial source/drain regions 70 may be epitaxially grown in the recesses. The epitaxy source/drain regions 70 may include or be silicon germanium, silicon carbide, silicon phosphorus, germanium, a III-V compound semiconductor, a II-VI compound semiconductor, or the like. Epitaxial source/drain regions 70 may be raised in relation to the fin 46, as illustrated. The epitaxial source/drain regions 70 may be doped by in-situ doping during the epitaxial growth and/or by implantation after the epitaxial growth. Hence, source/drain regions 70 can be formed by epitaxial growth, and possibly with implantation, on opposing sides of the dummy gate stack.

Figure 3A:
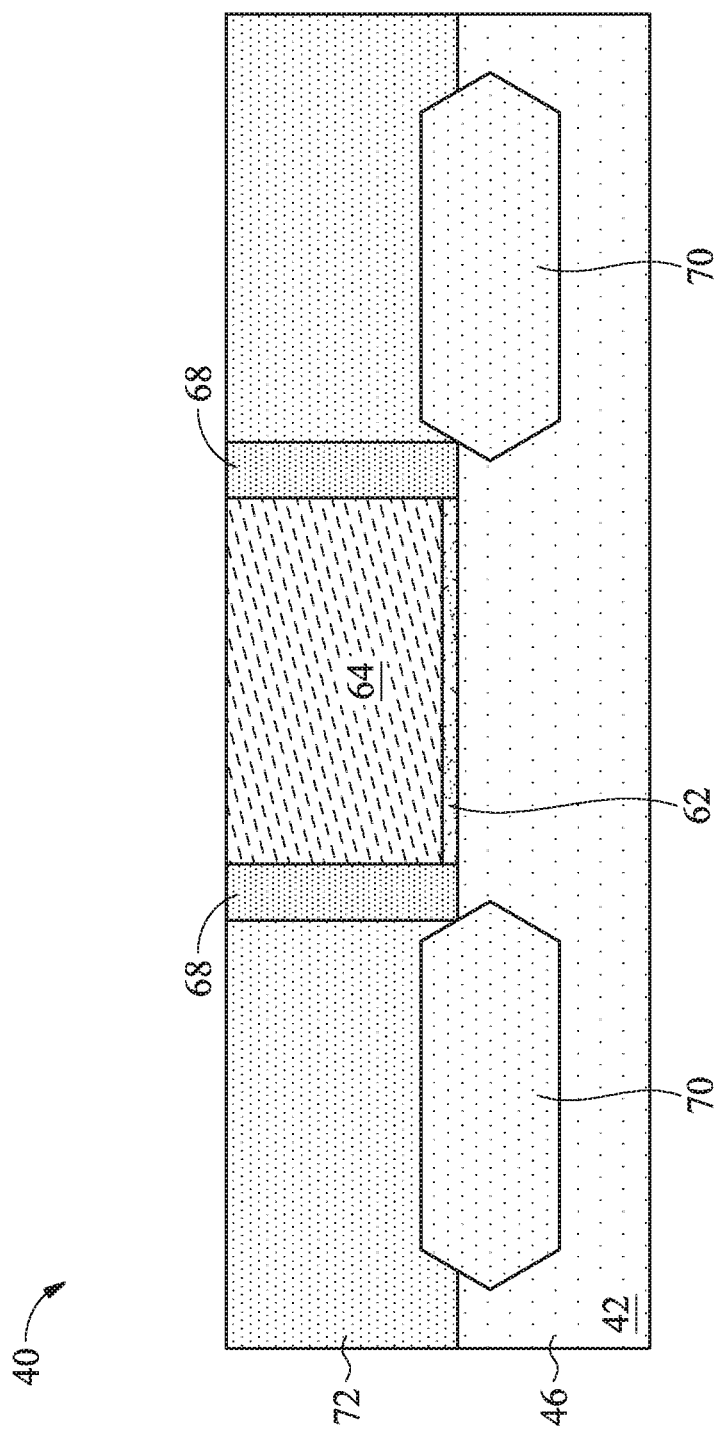
Figure 3B:
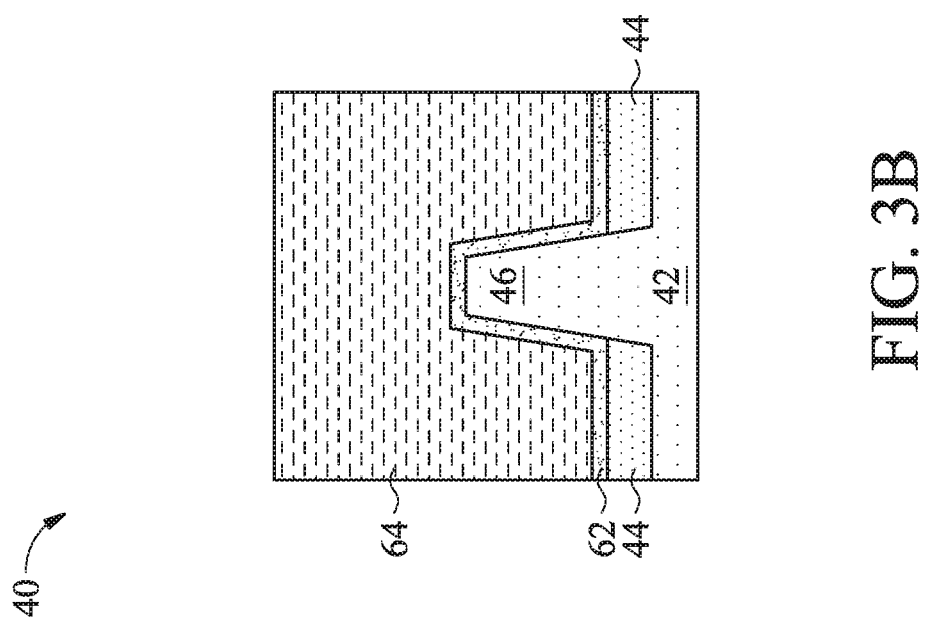

FIGS. 3A-B illustrate the formation of a first interlayer dielectric (ILD) 72 over the fin 46 of the semiconductor substrate 42 and along the gate spacers 68. Although not specifically illustrated, a contact etch stop layer (CESL) may be conformally formed over the fin 46 of the semiconductor substrate 42 and along the gate spacers 68, and the first ILD 72 can be formed over the CESL, in some examples. Generally, an etch stop layer can provide a mechanism to stop an etch process when forming, e.g., contacts or vias. An etch stop layer may be formed of a dielectric material having a different etch selectivity from adjacent layers, for example, the first ILD 72. For example, the CESL may be conformally deposited over the fin 46, dummy gate stack, and gate spacers 68. The CESL may comprise or be silicon nitride, silicon carbon nitride, silicon carbon oxide, carbon nitride, the like, or a combination thereof. Then, for example, the first ILD 72 is deposited over the CESL. The first ILD 72 may include or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiOxCy, Spin-On-Glass, Spin-On-Polymers, silicon carbon material, a compound thereof, a composite thereof, the like, or a combination thereof.

The first ILD 72 can be planarized, such as by a Chemical Mechanical Polish (CMP), after being deposited. The top surface of the first ILD 72 is planarized to be coplanar with the top surface of the dummy gate layer 64 to thereby expose the dummy gate layer 64 through the first ILD 72. The planarization may remove the mask layer 66 of the dummy gate stack (and, in some instances, upper portions of the gate spacers 68), and accordingly, the top surface of the dummy gate layer 64 of the dummy gate stack is exposed through the first ILD 72.

Figure 4A:
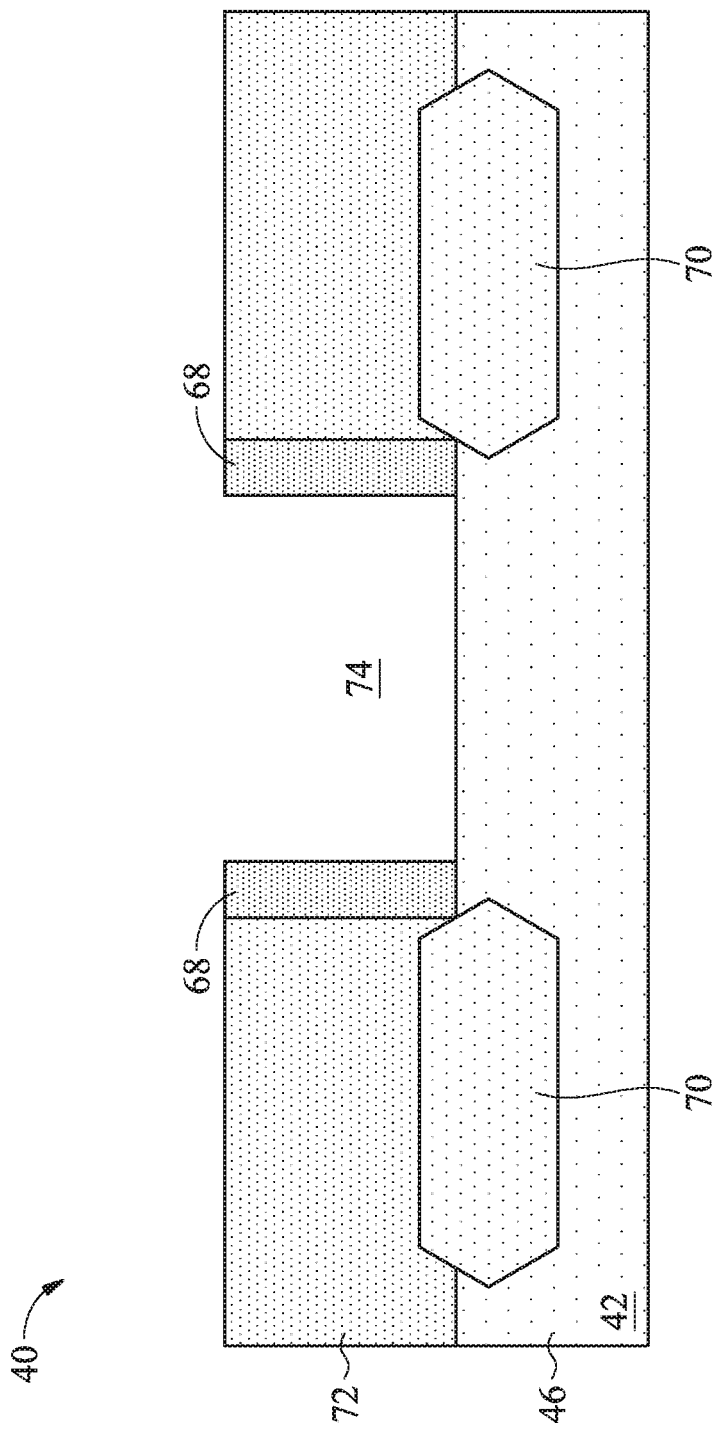
Figure 4B:
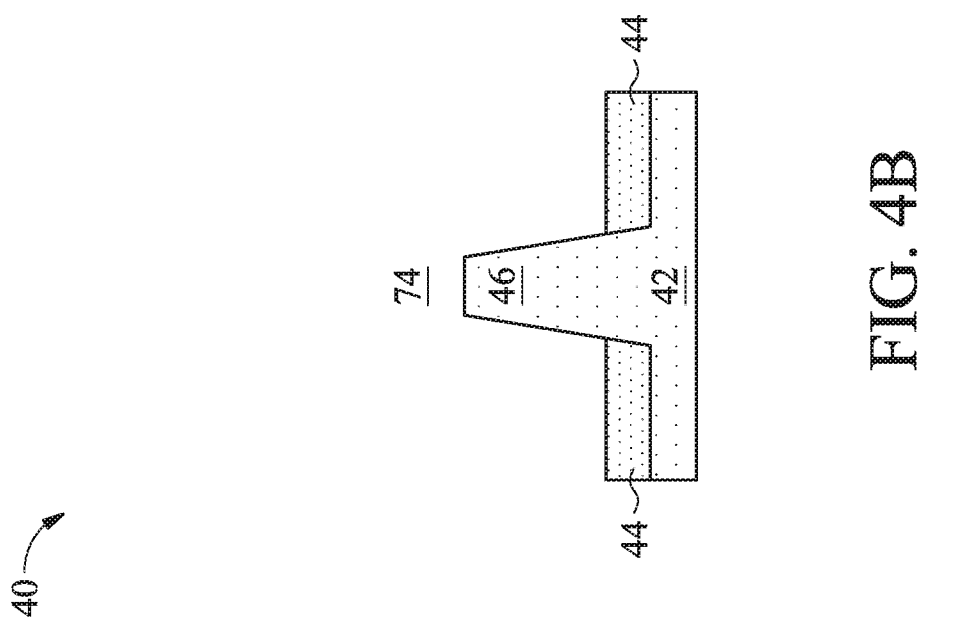

FIGS. 4A-B illustrate the removal of the dummy gate stack, which forms a recess 74 between the gate spacers 68. Once exposed through the first ILD 72, the dummy gate layer 64 and interfacial dielectric 62 of the dummy gate stack are removed, such as by one or more etch processes.

Figure 5A:
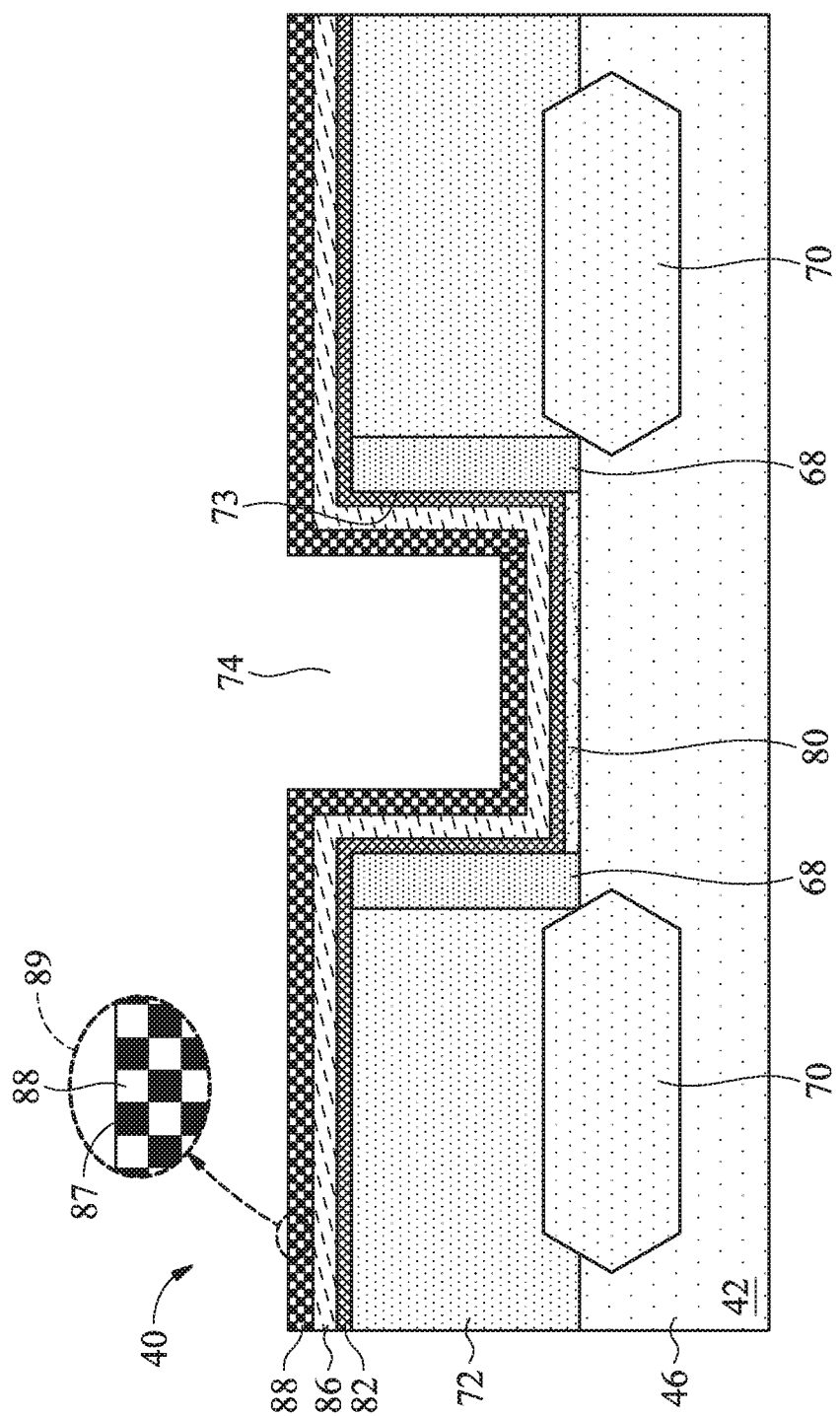
Figure 5B:
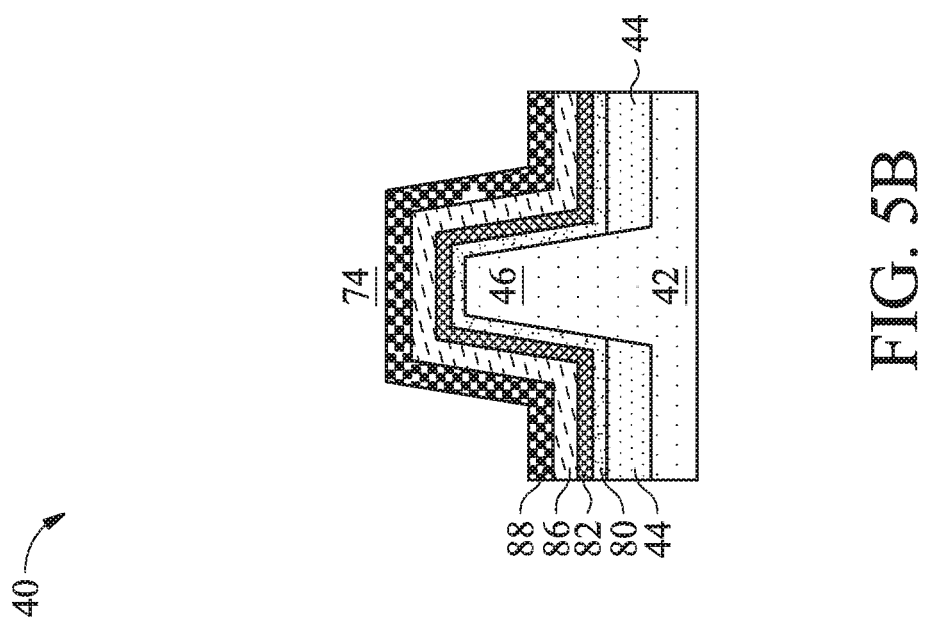

FIGS. 5A-B illustrate the formation of, among others, an interfacial dielectric 80, a gate dielectric layer 82, and a barrier layer 86 in the recess 74. In some examples, such as illustrated, the interfacial dielectric 80 is formed on the fin 46 of the semiconductor substrate 42 exposed through the recess 74 and between the gate spacers 68. The interfacial dielectric 80 can be, for example, an oxide formed by thermal or chemical oxidation. In some examples, the interfacial dielectric 62 of the dummy gate stack can remain and be in the place of the interfacial dielectric 80. In further examples, the interfacial dielectric 80 may result from various processing steps, such as being a native oxide formed as a result of a cleaning process. In other examples, the interfacial dielectric 80 may be omitted.

The gate dielectric layer 82 is conformally deposited in the recess 74. For example, the gate dielectric layer 82 is deposited over the interfacial dielectric 80, along sidewalls 73 of the gate spacers 68, and over top surfaces of the gate spacers 68 and first ILD 72. The gate dielectric layer 82 and the interfacial dielectric 80 may be described as a high-k gate stack. The gate dielectric layer 82 can be or include silicon oxide, silicon nitride, a high-k dielectric material, multilayers thereof, or other dielectric material. A high-k dielectric material may have a k value of about 4 or greater, for example about 7.0 or greater, and may include a metal oxide of or a metal silicate of Hf, Al, Zr, La, Mg, Ba, Ti, Pb, or a combination thereof. Some examples for the gate dielectric layer 82 may include, but are not limited to, $TiO_2$, $HfO_2$, $HfZrO$, $Ta_2O_3$, $HfSiO_4$, $ZrO_2$, $ZrSiO_2$, etc. In some embodiments, the gate dielectric layer 82 is hafnium oxide ($HfO_2$). The gate dielectric layer 82 can be deposited by atomic layer deposition (ALD), plasma enhanced chemical vapor deposition (PECVD), molecular beam deposition (MBD), or any suitable deposition technique. The gate dielectric layer 82 can have a thickness in a range from about 5 Å to about 25 Å.

The barrier layer 86 is conformally deposited over the gate dielectric layer 82. The barrier layer 86 may include or be tantalum nitride, tantalum-silicon nitride, tantalum-carbon nitride, tantalum-aluminum nitride, titanium nitride, titanium-silicon nitride, titanium-carbon nitride, titanium-aluminum nitride, aluminum nitride, the like, or a combination thereof, and may be deposited by ALD, PECVD, MBD, or any suitable deposition technique. In some embodiments, the barrier layer 86 is a titanium-silicon nitride (TSN).

FIGS. 5A-B further illustrates a dummy layer 88 is conformally deposited over the barrier layer 86. It has been observed that the gate dielectric layer 82 may suffer from high densities of interfacial and bulk defects generated during the formation of the gate dielectric layer 82 or the subsequent high temperature processes. These high densities of interfacial and bulk defects could increase carrier scattering, degrade mobility, and reduce drain current for the subsequent gate. Various embodiments may provide a conformal dummy layer 88 over the gate dielectric layer 82, which may address such problems. The dummy layer 88 contains passivating species 87 that can be diffused or driven into the gate dielectric layer 82 and passivate interfacial and/or bulk defects for any of a plurality of layers which make up the replacement gate structure. A subsequent thermal process (e.g., a rapid thermal anneal process) can be performed to help incorporate the passivating species 87 into the gate dielectric layer 82. The conformal nature of the dummy layer 88 helps ensure the passivating species is uniformly distributed throughout the gate dielectric layer 82, which is also conformally deposited over the interfacial dielectric 80, along sidewalls 73 of the gate spacers 68, and over top surfaces of the gate spacers 68 and first ILD 72. The passivating species in the gate dielectric layer 82 can effectively reduce defect densities, for example by passivation of interfacial dangling bonds and bulk oxygen vacancies in or at the surface of the gate dielectric layer 82, which in turn may reduce oxide leakage current, improve threshold voltage stability, and generally improve device performance.

Examples described herein use fluorine, deuterium, or both, as a dopant or passivating species, and hence, the dummy layer 88 may contain fluorine, deuterium, or both. Description with respect to fluorine or deuterium herein may be more broadly and generally applied to any appropriate passivating species. In some embodiments, the dummy layer 88 is conformally deposited on the barrier layer 86. The dopants or passivating species are in-situ doped during deposition or formation of the dummy layer. For example, fluorine and/or deuterium are incorporated into the dummy layer 88 while the dummy layer 88 is deposited. Therefore, the dummy layer 88 as deposited may contain fluorine, deuterium, or both. Inset 89 in FIG. 5A is a partially enlarged view showing the passivating species 87 (represented by black blocks) is formed in the dummy layer 88. The dummy layer 88 may include or be a silicon layer, for example a polysilicon layer or an amorphous silicon layer that includes the passivating species 87. In some embodiments, the dummy layer 88 is an amorphous silicon layer that includes the passivating species 87.

The dummy layer 88 may be deposited by a chemical vapor deposition (CVD) process, such as thermal CVD, cyclic CVD, PECVD, or cyclic PECVD; an ALD process, such as thermal ALD, plasma-enhanced ALD, radical-enhanced ALD; or any other deposition technique suitable for forming a conformal film. In various embodiments, the dummy layer 88 can have a thickness in a range from about 5 Å to about 50 Å, for example about 10 Å to about 30 Å. An amount of fluorine or deuterium available to diffuse from the dummy layer 88 into the gate dielectric layer 82 may be affected by the thickness of the dummy layer 88, which in turn can determine a volume of the dummy layer 88, and the concentration of fluorine and/or deuterium in the dummy layer 88. A higher amount of fluorine or deuterium available for diffusion can increase an amount of fluorine or deuterium to be diffused into the gate dielectric layer 82.

The dummy layer 88 may be formed by exposing the substrate surface of the intermediate FinFET structure 40 to a gas mixture of a silicon-containing precursor and a dopant gas at elevated temperatures. The term "substrate surface" in this disclosure is intended to include the exposed surface of a film/layer or partial film/layer that has been deposited onto a substrate, such as the semiconductor substrate 42, and the exposed surface of the newly deposited film/layer can also become the substrate surface prior to any subsequent process (es). In this case, the substrate surface at this stage of the processing refers to the exposed surface of the dummy layer 88. Suitable silicon-containing precursors may include silanes, halogenated silanes, or any combination thereof. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$). Halogenated silanes may include, but are not limited to, a chlorinated silane, such as monochlorosilane ($SiH_3Cl$), dichlorosilane ($Si_2H_2Cl_2$), trichlorosilane ($SiHCl_3$), tetrachlorosilane ($SiCl_4$), hexachlorodisilane ($Si_2Cl_6$), octachlorotrisilane ($Si_3Cl_8$). In some embodiments, the silicon-containing precursor may use organosilanes which may include compounds with the empirical formula $R_ySi_xH_{(2x+2-y)}$, where R is independently methyl, ethyl, propyl, or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$), tris(dimethylamino)silane (TDMAS), and any combination thereof.

Depending on the dopant desired in the dummy layer 88, the dopant gas may be a fluorine-containing gas, a deuterium-containing gas, or both. Suitable fluorine-containing gas may include, but is not limited to, silicon tetrafluoride ($SiF_4$), fluorine ($F_2$), nitrogen trifluoride ($NF_3$), tetrafluorohydrazine ($N_2F_4$), trifluoromethane ($CHF_3$), fluorinated hydrocarbons having a general formula of $C_xF_y$ (x>1, y>1), the like, or any appropriate combination thereof. In some cases, the fluorine-containing gas may be carbon-free. In some embodiments, the fluorine-containing gas is $SiF_4$. The use of $SiF_4$ may be advantageous in some applications as it offers minimized aggressive etch component as compared to other fluorine-containing gas at high temperatures.

Suitable deuterium-containing gas may include, but is not limited to, deuterium ($D_2$), deuterated silane ($SiD_4$), deuterated disilane ($Si_2D_6$), dichlorosilane deuterium ($SiD_2Cl_2$), trichlorosilane deuterated silane ($SiDCl_3$), chlorine deuterated silane ($SiD_3Cl$), or any appropriate combination thereof. In some embodiments, the deuterium-containing gas is $SiD_4$.

In some embodiments, the silicon-containing precursor is flowed into the process chamber in which the intermediate FinFET structure 40 is disposed at a first volumetric flowrate, and the dopant gas is flowed into the process chamber at a second volumetric flowrate. A ratio of the first volumetric flowrate to the second volumetric flowrate can be controlled in a range from about 8:1 to about 20:1, such as from about 10:1 to about 18:1, for example about 12:1 to about 15:1.

In some embodiments, the dummy layer 88 is a fluorine-doped silicon deposited by a CVD process. Example CVD process may include: providing a wafer, such as the semiconductor substrate 42, into a CVD chamber and maintaining the chamber at a temperature in a range from about 350° C. to about 550° C., for example about 400° C. to about 450° C., and at a pressure in a range from about 1 mTorr to about 100 Torr, such as about 1.5 mTorr to about 50 mTorr. The silicon-containing precursor, such as $SiH_4$, and a fluorine-containing precursor, such as $SiF_4$, are introduced simultaneously or sequentially into the CVD chamber. The silicon-containing precursor and the fluorine-containing precursor can be pre-mixed and introduced as a gas mixture into the CVD chamber. In some examples, the silicon-containing precursor and the fluorine-containing precursor can be introduced separately into the CVD chamber. The duration of the process for fluorination may be in a range from about 2 seconds to about 180 seconds, such as about 15 seconds to about 60 seconds, for example about 20 seconds to about 35 seconds. Generally, the duration and temperature(s) at which the dummy layer 88 is in the intermediate structure can affect how much fluorine diffuses into the gate dielectric layer 82. A higher temperature process and/or a longer duration can increase the amount of fluorine that diffuses into the gate dielectric layer 82. This process may be repeated for multiple cycles until a pre-determined thickness of the dummy layer 88 is reached.

Varying the thickness of the dummy layer 88 can increase or decrease the amount of passivating species (e.g., fluorine or deuterium) available to diffuse into the gate dielectric layer 82, and therefore, can increase or decrease the amount of passivating species that diffuse into the gate dielectric layer 82. Similarly, increasing or decreasing the thickness of the barrier layer 86 can also increase or decrease the ability of passivating species to diffuse through the barrier layer 86, and can therefore increase or decrease the amount of passivating species that diffuse into the gate dielectric layer 82. In various embodiments, the dummy layer 88 may have a thickness in a range of about 10 Å to about 50 Å, while the barrier layer 86 may have a thickness in a range of about 5 Å to about 30 Å.

In some embodiments where the silicon-containing precursor and the fluorine-containing precursor are introduced sequentially, the reactants may be introduced into the CVD chamber in any sequence (e.g., a silicon-containing precursor pulse and then a fluorine-containing precursor pulse, or vice versa). In either case, a purge gas (e.g., an inert gas such as argon) and/or a pump evacuation may be provided between the silicon-containing precursor and the fluorine-containing precursor. In such a case, the silicon-containing precursor can be introduced into the CVD chamber with a pulse in a range from about 2 seconds to about 30 seconds, such as about 5 seconds to about 20 seconds, followed by the purge gas and/or pump evacuation for a duration in a range from about 5 seconds to about 10 seconds. Then, the fluorine-containing precursor is introduced into the CVD chamber with a pulse in a range from about 1 second to about 10 seconds, such as about 2 seconds to about 8 seconds, for example about 3 seconds to about 5 seconds. This process may be repeated for multiple cycles until a pre-determined thickness of the dummy layer 88 is reached.

In some embodiments, the dummy layer 88 is fluorine-doped silicon deposited by an ALD process. Example ALD processes may include: providing a wafer, such as the semiconductor substrate 42, into an ALD chamber and maintaining the chamber at a temperature in a range from about 220° C. to about 450° C., for example about 250° C. to about 400° C., and at a pressure in a range from about 1 mTorr to about 10 Torr, such as about 1.5 mTorr to about 5 Torr. The ALD process may include sequential introduction of pulses of a first precursor, such as the silicon-containing precursor, and a second precursor, such as the dopant gas. For example, one cycle for the sequential introduction of a first precursor and a second precursor may include a pulse of the first precursor, followed by a pulse of a purge gas and/or pump evacuation, followed by a pulse of a second precursor, and followed by a pulse of the purge gas and/or pump evacuation. Likewise, such a cycle is repeated until a pre-determined thickness (e.g., about 10 Å to about 30 Å) of the dummy layer 88 is reached.

In either a CVD or ALD process, a plasma may be used to help facilitate dissociation of the precursors into species or radicals. Plasma may be generated by coupling an electromagnetic power, for example, an RF power, to the gas mixture (of the silicon-containing precursor and the fluorine-containing precursor) or to each pulse of the precursor during the CVD or ALD process. The RF power may be switched off and only the purge gas is supplied into the process chamber. If plasma is used, the RF power may be operated at a power in a range from about 5 Watts to about 5000 Watts, such as about 150 Watts to about 1000 Watts, and a frequency in a range from about 1 MHz and about 60 MHz. for example about 13.56 MHz. The plasma may have a power density in a range from about 1 Watts/$cm^2$ to about 10 Watts/$cm^2$, such as about 2 Watts/$cm^2$ to about 8 Watts/$cm^2$.

A person having ordinary skill in the art should readily understand that the above process(es) and parameters may be equally applicable to the formation of a dummy layer 88 including or being deuterium-doped silicon. The parameters discussed in this disclosure may vary depending upon the application and/or the sizes of respective components of the semiconductor device structure.

After the dummy layer 88 is conformally deposited on the barrier layer 86, one or more thermal processes are performed to facilitate diffusion of the passivating species 87, or to drive the passivating species 87, from the dummy layer 88 into the gate dielectric layer 82. The gate dielectric layer 82 thereafter comprises fluorine, deuterium, or both. As a result, a conformal fluorinated or deuterated gate dielectric layer 82 is formed. The passivating species 87 can passivate the gate dielectric layer 82 by filling the oxygen vacancies in the gate dielectric layer 82 and/or attaching to dangling bonds. Therefore, charge trapping and interfacial charge scattering can be reduced. Particularly, since fluorine and/or deuterium are diffused from the conformal dummy layer 88 into the gate dielectric layer 82, the gate dielectric layer 82 may be doped with fluorine and/or deuterium more conformally and with better coverage, as compared to conventional ion-implantation process where side or bottom portions of the gate dielectric layer may not receive a full dose of the dopant implant due to the three-dimensional geometry of the FinFET device. Thus, reduction of defects within the gate stack may not be effectively performed along the side or bottom portions of the gate dielectric layer.

Figure 6A:
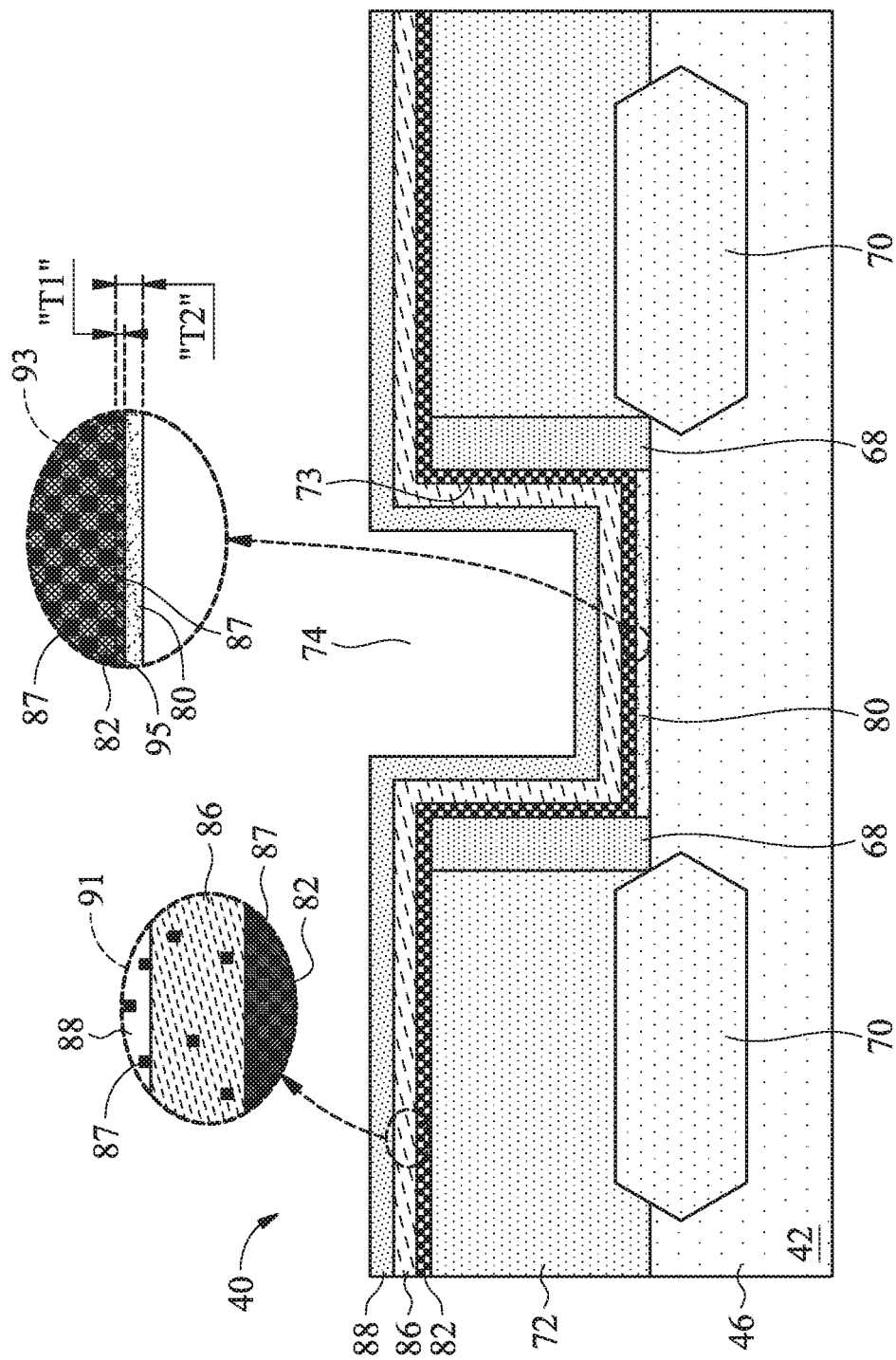
Figure 6B:
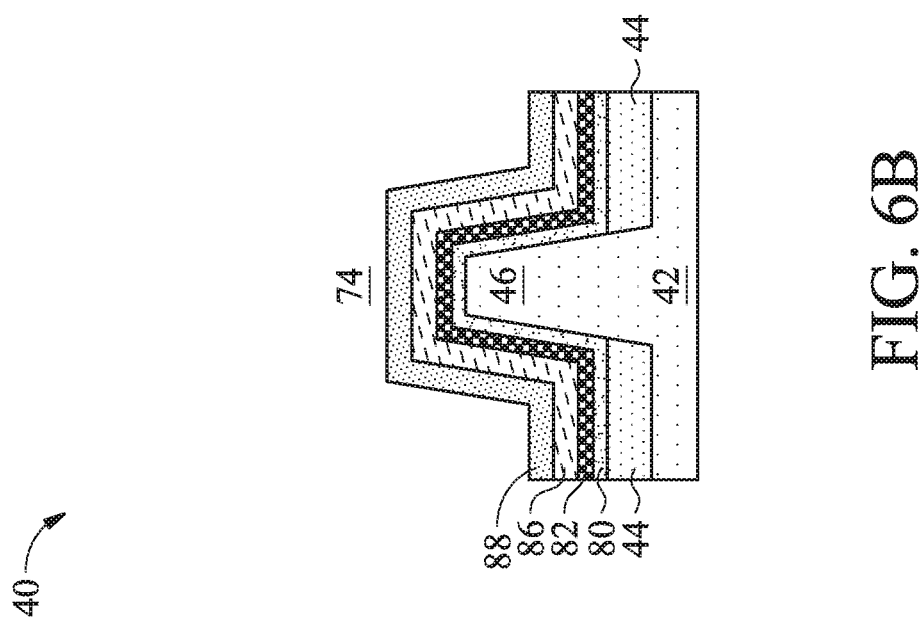

FIGS. 6A-B illustrate the intermediate FinFET structure 40 at an intermediate stage of processing in which some of the passivating species 87 have been diffused into the gate dielectric layer 82 from the dummy layer 88. Depending on the duration of the process, the majority of the passivating species 87 may remain in the dummy layer 88 with a decreasing concentration from the interface between the dummy layer 88 and the barrier layer 86 toward the gate dielectric layer 82. In some examples, the passivating species 87 can distribute throughout the gate dielectric layer 82 after the one or more thermal processes. Inset 91 in FIG. 6A is partially enlarged view showing the dummy layer 88 and the barrier layer 86 may have a detectable amount of the passivating species 87 after the one or more thermal processes in some cases.

The gate dielectric layer 82 may generally contain an amount of the passivating species 87 less than an amount of the passivating species 87 in the dummy layer 88 due to a small portion of the passivating species might have been trapped or left in the barrier layer 86 and the dummy layer 88. In some embodiments, the gate dielectric layer 82 may contain a concentration of fluorine or deuterium (the passivating species 87) in a range from about 1 at. % to about 15 at. %, such as about 3 at. % to about 12 at. %, for example about 6 at. % to about 10 at. %. In some embodiments, the gate dielectric layer 82 may contain a mixture of fluorine and deuterium, where respective concentrations of fluorine and deuterium are each in a range from about 1 at. % to about 15 at. %. The passivating of the gate dielectric layer 82 may be less effective if the concentration of fluorine or deuterium in the gate dielectric layer 82 is below about 1 at. %. Controlling the concentration of fluorine or deuterium in the gate dielectric layer 82 to be in a range from about 1 at. % to about 15 at. % can passivate interfacial and/or bulk defects. Having the concentration of fluorine or deuterium be over 15 at. % can be problematic because excessive amount of fluorine and/or deuterium can replace the oxide atoms in the lattice structure of the gate dielectric layer 82 and cause the oxide atoms to move toward, and react with, the interfacial dielectric 80. Thus, the interfacial dielectric 80 may become thicker, which in turn lowers the dielectric constant of the interfacial dielectric 80 and/or the gate-to-channel capacitance and/or undesirably affects the electrical properties of the device.

The concentration of the passivating species 87 may be a gradient in the gate dielectric layer 82 along the thickness of the gate dielectric layer 82. For example, portions of the gate dielectric layer 82 inward to the gate replacement structure (e.g., distal from respective gate spacers 68 on which vertical portions of the gate dielectric layer 82 are disposed, and distal from the semiconductor substrate 42 on which a horizontal portion of the gate dielectric layer 82 is disposed) may have a greatest concentration in the gate dielectric layer 82, and the concentration of passivating species 87 decreases as the gate dielectric layer 82 is traversed away from the portions having the greatest concentration (e.g., traversed in an outwardly direction of the replacement gate structure). Such a gradient of the concentration of the passivating species may result from diffusion caused by the one or more thermal process(es) described herein.

In some embodiments, the passivating species 87 may also diffuse into a top portion of the interfacial dielectric 80. Inset 93 in FIG. 6A is a partially enlarged view showing a small amount of passivating species 87 (represented by black blocks) are present in the top portion of the interfacial dielectric 80 after one or more thermal process(es). The passivating species 87 may diffuse into the interfacial dielectric 80 and form a surface region 95 having a first thickness "T1" and the interfacial dielectric 80 may have a second thickness "T2", and the ratio of "T1" to "T2" can be in a range from about 1:10 to about 1:60, such as about 1:20 to about 1:40, for example about 1:30.

The one or more thermal processes may be an in-situ process, e.g., the one or more thermal processes are performed in the same process chamber used to form the dummy layer 88, while maintaining the vacuum of the process chamber. In some cases, the one or more thermal processes may be performed by transferring the wafer, e.g., the intermediate FinFET structure 40, to another process chamber fluidly connected to the process chamber used to deposit the dummy layer 88, while maintaining the wafer under vacuum. Example thermal processes can be at a temperature in a range from about 300° C. to about 850° C., for example about 350° C. to about 450° C., and for a duration of about 15 seconds to about 240 seconds, for example about 60 seconds to about 100 seconds.

In some embodiments, the thermal process is a rapid thermal anneal (RTA) process, such as a spike anneal, impulse anneal, laser anneal, or flash-assist anneal. In such a case, the duration of the RTA process may be on the order of a millisecond scale, such as about 0.1 milliseconds to about 500 milliseconds, for example about 1 millisecond to about 100 milliseconds. In some cases, the duration of the RTA process may be about 1 second to about 10 seconds. The temperature of the RTA process can be from about 800° C. to about 1200° C., for example about 900° C. A RTA process may be advantageous as it can provide precise control of processing temperature and time without damaging the semiconductor device.

Figure 7A:
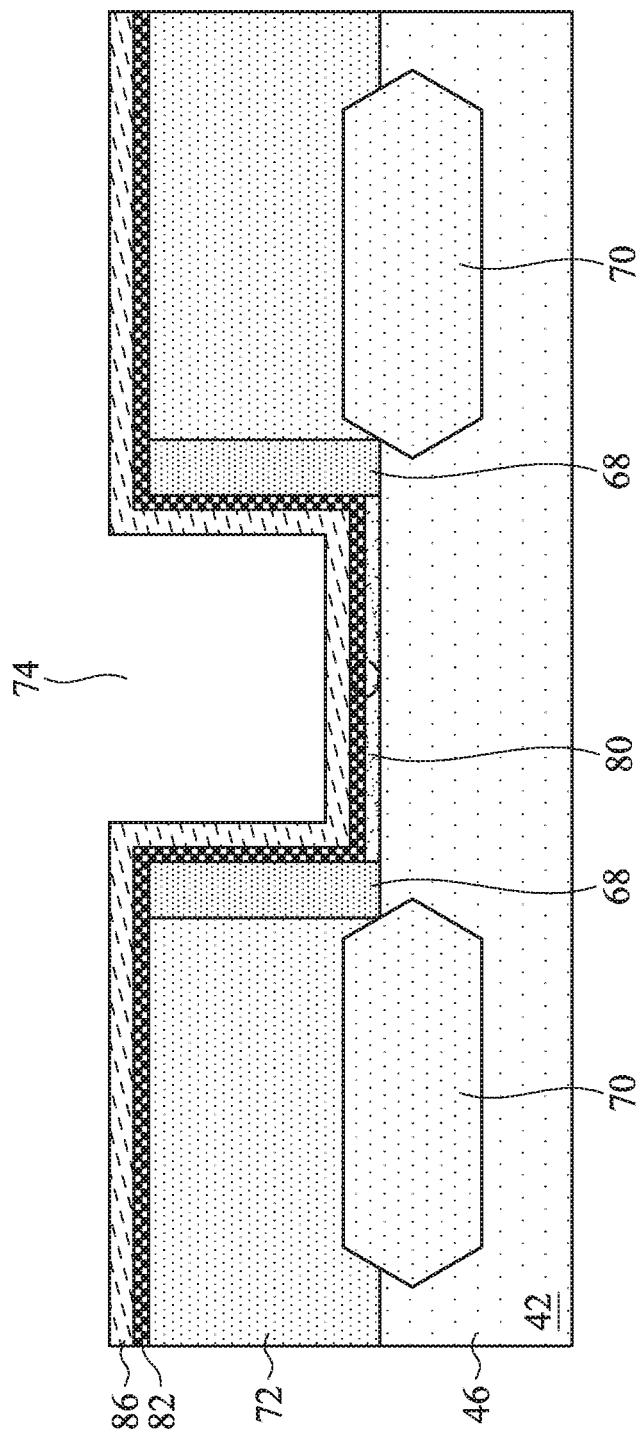
Figure 7B:
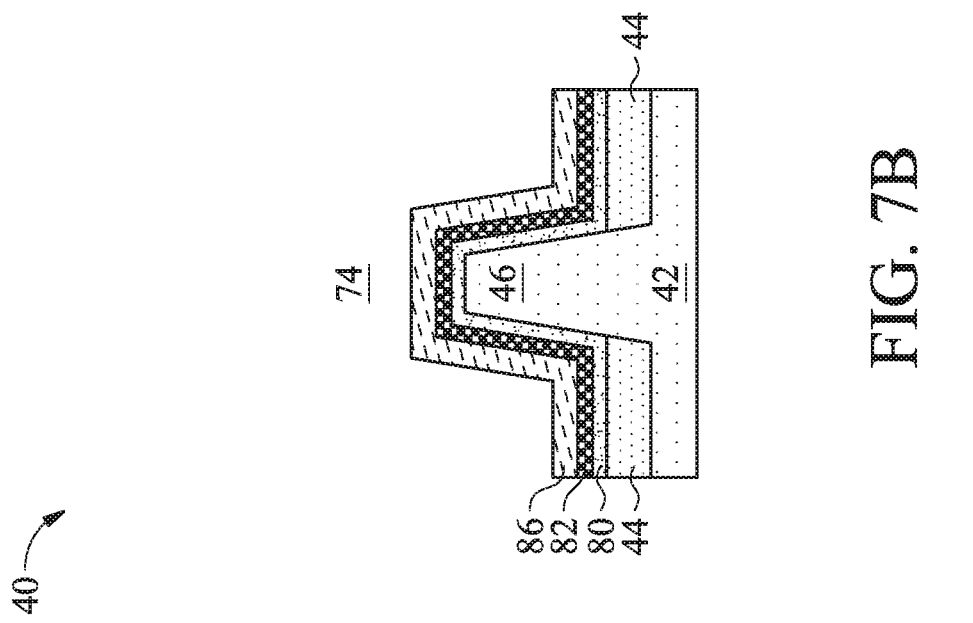

FIGS. 7A-B illustrate the removal of the dummy layer 88 after the thermal process(es). The dummy layer 88 may be removed by one or more etch processes and cleaning process. For example, the dummy layer 88 may be removed by an etch process selective to the materials of the dummy layer 88. The one or more etch processes can be, for example, an isotropic etch process, such as a wet etch like using phosphoric acid ($H_3PO_4$), or any suitable etch process. After the removal of the dummy layer 88, the underlying layer, e.g., the barrier layer 86, is exposed.

Figure 8A:
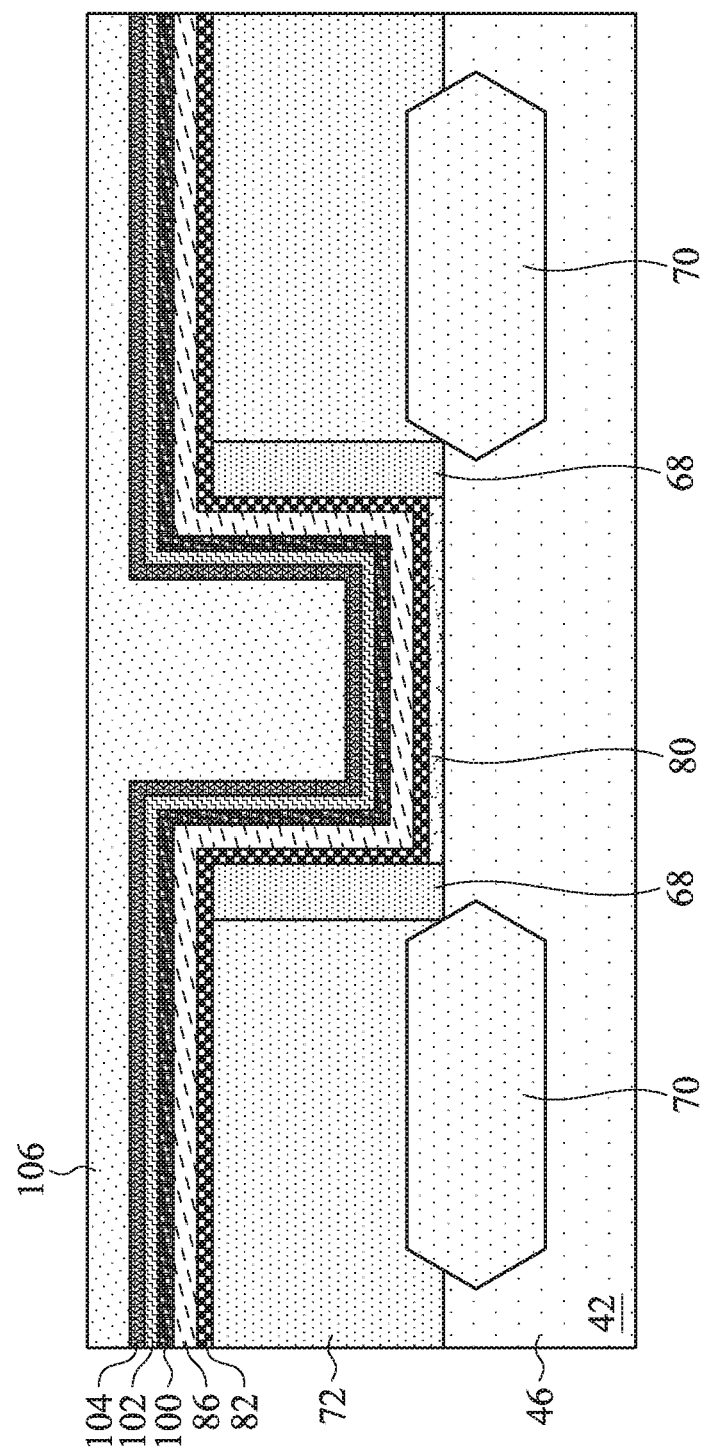
Figure 8B:
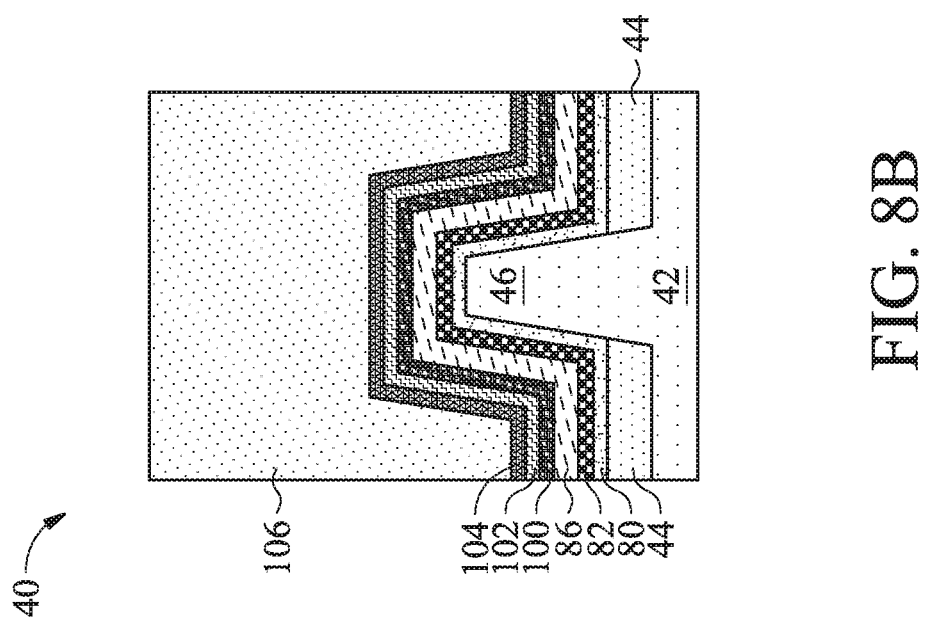

FIGS. 8A-B illustrate a first work-function tuning layer 100, a second work-function tuning layer 102, a barrier/adhesion layer 104, and a gate metal fill 106 are sequentially formed over the barrier layer 86. The first work-function tuning layer 100 is conformally deposited on the barrier layer 86. The first work-function tuning layer 100 may include or be titanium nitride (TiN), titanium-silicon nitride (TSN), titanium-carbon nitride, titanium-aluminum nitride, tantalum nitride, tantalum-silicon nitride ($TaSi_xN_y$), tantalum-carbon nitride, tungsten nitride, tungsten carbide, tungsten-carbon nitride, cobalt, platinum, the like, or a combination thereof, and may be deposited by ALD, PECVD, MBD, or any suitable deposition technique. The first work-function tuning layer 100 can have a thickness in a range from about 5 Å to about 60 Å. The second work-function tuning layer 102 is conformally deposited on the first work-function tuning layer 100. The second work-function tuning layer 102 may include or be titanium aluminum carbide (TiAlC), a titanium aluminum alloy, tantalum-aluminum carbide, the like, or a combination thereof, and may be deposited by ALD, PECVD, MBD, or any suitable deposition technique. The second work-function tuning layer 102 can have a thickness in a range from about 10 Å to about 60 Å. In some examples, the first or second work-function tuning layer 100, 102 may be omitted. Other examples can have various other configurations of work-function tuning layers to achieve a desired performance of the device to be formed. For example, any different number of work-function layers having various materials and/or thicknesses may be used. In some instances, for example, a p-type FET and an n-type FET may have different work-function tuning layer(s).

The barrier/adhesion layer 104 is conformally deposited on the second work-function tuning layer 102. The barrier/adhesion layer 104 may include or be titanium nitride, titanium-silicon nitride, titanium-carbon nitride, titanium-aluminum nitride, tantalum nitride, tantalum-silicon nitride, tantalum-carbon nitride, tungsten nitride, tungsten carbide, tungsten-carbon nitride, the like, or a combination thereof, and may be deposited by ALD, PECVD, MBD, or any suitable deposition technique. The barrier/adhesion layer 104 can have a thickness in a range from about 10 Å to about 50 Å. The gate metal fill 106 is then deposited on the barrier/adhesion layer 104. The gate metal fill 106 can fill remaining recess 74 where the dummy gate stack was removed. The gate metal fill 106 may be or comprise a metal-containing material such as tungsten, cobalt, ruthenium, aluminum, copper, multi-layers thereof, or a combination thereof. The gate metal fill 106 can be deposited by ALD, PECVD, MBD, PVD, or any suitable deposition technique.

The gate metal fill 106, barrier/adhesion layer 104, second work-function tuning layer 102, and first work-function tuning layer 100 may be substantially free of fluorine and deuterium (e.g., no traceable amount of fluorine and deuterium) since these layers are generally formed after fluorinating or deuternating the gate dielectric layer 82. Therefore, the work-function of the transistor may be more easily tuned since significant amounts of fluorine or deuterium are not presented in those layers to significantly impact the layers, and hence, performance of the transistor can be increased, such as an improved threshold voltage. In some cases, the gate metal fill 106, barrier/adhesion layer 104, second work-function tuning layer 102, and first work-function tuning layer 100 may have an insubstantial amount of fluorine and/or deuterium resulting, e.g., from natural diffusion reaction between layers, e.g., from the barrier layer 86 and gate dielectric layer 82.

Figure 9A:
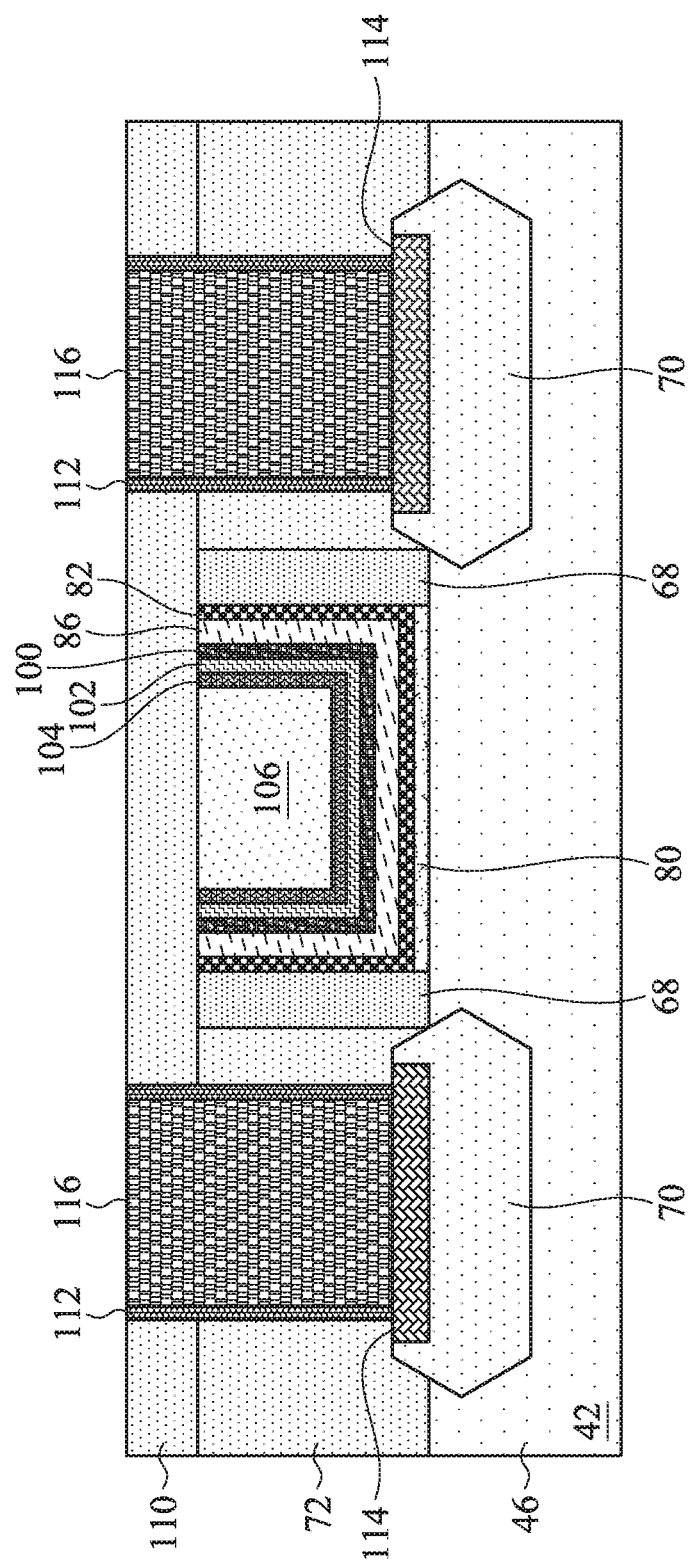
Figure 9B:
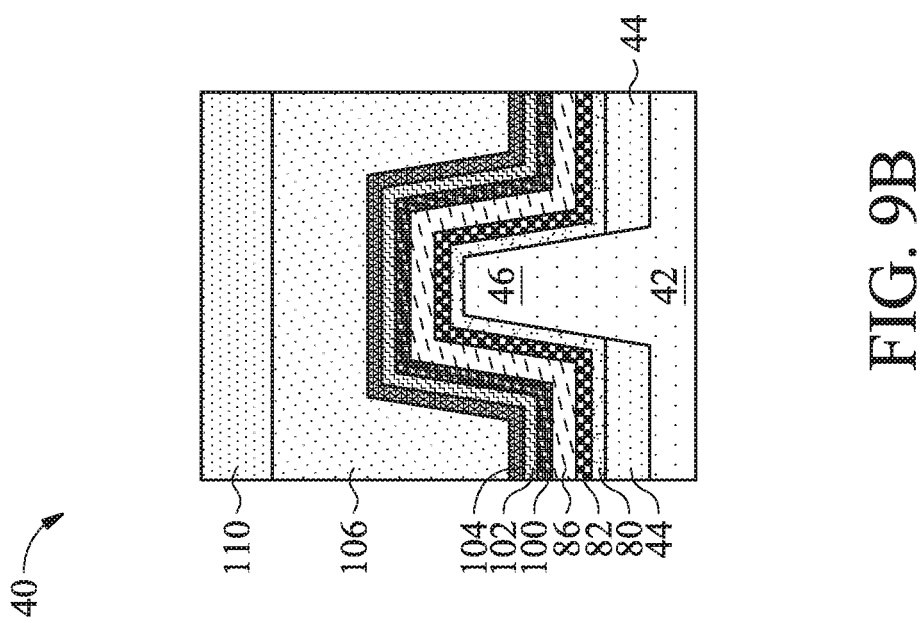

FIGS. 9A-B illustrate the removal of excess portions of the gate metal fill 106, barrier/adhesion layer 104, second work-function tuning layer 102, first work-function tuning layer 100, barrier layer 86, and gate dielectric layer 82 above the top surfaces of the first ILD 72 and gate spacers 68. For example, a planarization process, like a CMP, may be used to remove the portions of the gate metal fill 106, barrier/adhesion layer 104, second work-function tuning layer 102, first work-function tuning layer 100, barrier layer 86, and gate dielectric layer 82 above the top surfaces of the first ILD 72 and gate spacers 68. A replacement gate structure comprising the gate metal fill 106, barrier/adhesion layer 104, second work-function tuning layer 102, first work-function tuning layer 100, barrier layer 86, and gate dielectric layer 82 (e.g., a fluorinated and/or deuterated gate dielectric layer) may therefore be formed.

FIGS. 9A-B further illustrate the formation of a second ILD 110. The second ILD 110 is deposited over the first ILD 72, replacement gate structure, and gate spacers 68. An etch stop layer (ESL) may be implemented between, e.g., the first ILD 72 and the second ILD 110. For example, the ESL may be deposited over the first ILD 72, replacement gate structure, and gate spacers 68. Then, for example, the second ILD 110 is deposited over the ESL. The ESL and the second ILD 110 can be or include the same or similar materials, and can be deposited using any acceptable techniques, as described above with respect to the CESL and the first ILD 72, respectively. The second ILD 110 can be planarized, such as by a CMP, after being deposited.

FIGS. 9A-B further illustrate the formation of conductive features through the second ILD 110 and first ILD 72 to the source/drain regions 70. Openings are formed through the second ILD 110 and the first ILD 72. Each of the openings exposes a respective source/drain region 70. The openings may be formed using, for example, appropriate photolithography and etch processes. A liner 112 may be formed in the openings. The liner 112 can be conformally deposited along sidewalls of the openings and top surfaces of the source/drain regions 70. The liner 112 may be a diffusion barrier layer, an adhesion layer, or the like. The liner 112 may include or be titanium, titanium nitride, tantalum, tantalum nitride, or the like, and may be deposited by any suitable deposition technique. An anneal process may be performed to facilitate a reaction between at least respective portions of the liner 112 and the source/drain regions 70 form silicide regions 114 at the respective source/drain regions 70. A conductive material 116 is then formed on the liner 112 in the openings. The conductive material 116 may be or include a metal, such as cobalt, tungsten, copper, aluminum, gold, silver, alloys thereof, the like, or a combination thereof, and may be deposited by any suitable deposition technique. A planarization process, such as a CMP, may be performed to remove excess conductive material 116 and liner 112 from the top surface of the second ILD 110. The remaining liner 112, silicide regions 114, and conductive material 116 form the conductive features to the respective source/drain regions 70.

Embodiments described in this disclosure relate to formation of a gate structure of a device, such as in a replacement gate process, and the device formed thereby. In some examples, after a gate dielectric layer is deposited, a dummy layer containing a passivating species, such as fluorine or deuterium, is confomrally formed over the gate dielectric layer, and a thermal process causes the passivating species to diffuse from the dummy layer into the gate dielectric layer thereby passivating the gate dielectric layer. Fluorinating or deuternating the gate dielectric layer can passivate the gate dielectric layer by filling the oxygen vacancies and attaching to the dangling bonds at a surface of the gate dielectric layer and/or the channel in the semiconductor substrate. By fluorinating or deuternating the gate dielectric layer, charge trapping and interfacial charge scattering can be reduced. By diffusing fluorine or deuterium from a conformal dummy layer into the gate dielectric layer, as described above, the gate dielectric layer may be doped with fluorine or deuterium more conformally and with better coverage, which may be particularly advantageous for smaller technology nodes, such as 7 nm and smaller, and more particularly in three-dimensional (3D) technology such as FinFETs. The improved conformality of the fluorination or deuternation may permit reduced time-dependent dielectric breakdown (TDDB) degradation and permit greater reliability. Further, since some work-function tuning layers may be formed after fluorinating or deuternating the gate dielectric layer, the work-function of the transistor may be more easily tuned since significant amounts of fluorine are not in those layers to significantly impact the layers, and hence, performance of the transistor can be increased, such as an improved threshold voltage.

An embodiment is a method. The method includes conformally forming a gate dielectric layer on a fin extending from a substrate and along sidewalls of gate spacers over the fin, conformally depositing a dummy layer over the gate dielectric layer during a deposition process using a silicon-containing precursor and a dopant gas containing fluorine, deuterium, or a combination thereof, the dummy layer as deposited comprising a dopant of fluorine, deuterium, or a combination thereof, performing a thermal process to drive the dopant from the dummy layer into the gate dielectric layer, removing the dummy layer, and forming one or more metal-containing layers over the gate dielectric layer.

Another embodiment is a method. The method includes forming an interfacial dielectric along a surface of a fin extending from a substrate, forming a gate dielectric layer over the interfacial dielectric, conformally depositing a dummy layer over the gate dielectric layer during a deposition process using a silicon-containing precursor and a dopant gas containing fluorine, deuterium, or a combination thereof, the dummy layer as deposited comprising a passivating species, driving the passivating species from the dummy layer into the gate dielectric layer and into the interfacial dielectric to form a surface region containing the passivating species, removing the dummy layer, and forming a metal gate electrode over the gate dielectric layer.

A further embodiment is a structure. The structure includes a substrate having a fin extending from the substrate and a gate structure over the fin. The gate structure includes a gate dielectric layer comprising deuterium. The gate dielectric layer has a peak concentration of the deuterium in a range from 1 atomic percentage to 15 atomic percentage at a region distal from the fin. The gate dielectric layer also has a gradient concentration of the deuterium decreasing from the peak concentration towards the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor processing, the method comprising:
   conformally forming a gate dielectric layer on a fin extending from a substrate and along sidewalls of gate spacers over the fin;
   conformally depositing a dummy layer over the gate dielectric layer during a deposition process using a silicon-containing precursor and a dopant gas containing fluorine, deuterium, or a combination thereof, the dummy layer as deposited comprising a dopant of fluorine, deuterium, or a combination thereof;
   performing a thermal process to drive the dopant from the dummy layer into the gate dielectric layer;
   removing the dummy layer; and
   forming one or more metal-containing layers over the gate dielectric layer.

2. The method of claim 1, wherein the dummy layer is an amorphous silicon layer.

3. The method of claim 1, wherein, after forming the one or more metal-containing layers, the gate dielectric layer comprises fluorine at a concentration in a range from about 1 atomic percentage to about 15 atomic percentage.

4. The method of claim 1, wherein, after forming the one or more metal-containing layers, the gate dielectric layer comprises deuterium at a concentration in a range from about 1 atomic percentage to about 15 atomic percentage.

5. The method of claim 1, wherein, after forming the one or more metal-containing layers, the gate dielectric layer comprises fluorine and deuterium, and respective concentrations of fluorine and deuterium are each in a range from about 1 atomic percentage to about 15 atomic percentage.

6. The method of claim 1, wherein the dummy layer is formed by exposing the substrate to sequential pulses of (i) a gas mixture containing the silicon-containing precursor and the dopant gas, and (ii) a purge gas until a pre-determined thickness of the dummy layer is reached.

7. The method of claim 1, wherein the dummy layer is formed by exposing the substrate to sequential pulses of the silicon-containing precursor, a purge gas, and the dopant gas until a pre-determined thickness of the dummy layer is reached.

8. The method of claim 1, wherein the silicon-containing precursor comprises silanes, halogenated silanes, or a combination thereof, and the dopant gas comprises silicon tetrafluoride ($SiF_4$), deuterated silane ($SiD_4$), or a combination thereof.

9. A method for semiconductor processing, the method comprising:
   forming an interfacial dielectric along a surface of a fin extending from a substrate;
   forming a gate dielectric layer over the interfacial dielectric;
   conformally depositing a dummy layer over the gate dielectric layer during a deposition process using a silicon-containing precursor and a dopant gas containing fluorine, deuterium, or a combination thereof, the dummy layer as deposited comprising a passivating species;
   driving the passivating species from the dummy layer into the gate dielectric layer and into the interfacial dielectric to form a surface region containing the passivating species;
   removing the dummy layer; and
   forming a metal gate electrode over the gate dielectric layer.

10. The method of claim 9, further comprising:
    forming a barrier layer between the gate dielectric layer and the dummy layer.

11. The method of claim 9, wherein the interfacial dielectric has a first thickness and the surface region has a second thickness, and a ratio of the second thickness to the first thickness is in a range from 1:20 to 1:40.

12. The method of claim 9, wherein the dummy layer is fluorine-doped amorphous silicon deposited by a cyclic Chemical Vapor Deposition (CVD) process or an Atomic Layer Deposition (ALD) process.

13. The method of claim 9, wherein the dummy layer is deuterium-doped amorphous silicon deposited by a cyclic Chemical Vapor Deposition (CVD) process or an Atomic Layer Deposition (ALD) process.

14. The method of claim 9, wherein, after forming a metal gate electrode, the gate dielectric layer comprises passivating species at a concentration in a range from about 1 atomic percentage to about 15 atomic percentage.

15. The method of claim 9, wherein driving the passivating species from the dummy layer into the gate dielectric layer and into the interfacial dielectric is performed by a Rapid Thermal Anneal (RTA).

16. A structure comprising:
    a substrate having a fin extending from the substrate; and
    a gate structure over the fin, the gate structure comprising:

a gate dielectric layer comprising deuterium, the gate dielectric layer having a peak concentration of the deuterium in a range from 1 atomic percentage to 15 atomic percentage at a region distal from the fin and a gradient concentration of the deuterium decreasing from the peak concentration towards the fin.

17. The structure of claim 16, further comprising:

a work-function tuning layer over the gate dielectric layer; and a gate metal fill over the work-function tuning layer, wherein at least one of the work-function tuning layer and the gate metal fill is substantially free of fluorine.

18. The structure of claim 17, wherein the gate structure is disposed between a first gate spacer and a second gate spacer, the first gate spacer and the second gate spacer being over the fin, the gate dielectric layer further being along respective sidewalls of the first gate spacer and the second gate spacer, the gate structure further comprising:

a barrier layer over the gate dielectric layer, the work-function tuning layer being over the barrier layer; and a barrier/adhesion layer over the work-function tuning layer, the gate metal fill being over the barrier/adhesion layer.

19. The structure of claim 18, wherein the barrier layer comprises titanium-silicon nitride or tantalum-silicon nitride.

20. The structure of claim 16 further comprising:

an interfacial dielectric along a surface of the fin, the gate dielectric layer being over the interfacial dielectric, and the interfacial dielectric having a surface region comprising deuterium, wherein the surface region has a first thickness, and the interfacial dielectric has a second thickness, and a ratio of the first thickness to the second thickness is in a range from 1:20 to 1:40.

* * * * *